(12) United States Patent
Baisl et al.

(10) Patent No.: US 10,529,955 B2
(45) Date of Patent: Jan. 7, 2020

(54) METHOD FOR PRODUCING AN ORGANIC ELECTRONIC DEVICE

(71) Applicant: OSRAM OLED GmbH, Regensburg (DE)

(72) Inventors: Richard Baisl, Regensburg (DE); Philipp Schwamb, Regensburg (DE); Simon Schicktanz, Regensburg (DE); Johannes Rosenberger, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/874,745

(22) Filed: Jan. 18, 2018

(65) Prior Publication Data

US 2018/0205041 A1   Jul. 19, 2018

(30) Foreign Application Priority Data

Jan. 18, 2017 (DE) .................. 10 2017 100 929

(51) Int. Cl.
| *H01L 51/56* | (2006.01) |
| *H01L 51/42* | (2006.01) |
| *H01L 51/00* | (2006.01) |
| *H01L 51/50* | (2006.01) |
| *H01L 21/02* | (2006.01) |
| *H01L 27/32* | (2006.01) |
| *H01L 27/30* | (2006.01) |
| *H01L 51/52* | (2006.01) |

(52) U.S. Cl.
CPC .......... *H01L 51/56* (2013.01); *H01L 51/0015* (2013.01); *H01L 51/42* (2013.01); *H01L 51/5072* (2013.01); *H01L 21/02697* (2013.01); *H01L 27/30* (2013.01); *H01L 27/32* (2013.01); *H01L 51/0017* (2013.01); *H01L 51/5203* (2013.01)

(58) Field of Classification Search
None
See application file for complete search history.

(56) References Cited

U.S. PATENT DOCUMENTS

| 6,468,819 | B1 * | 10/2002 | Kim ..................... H01L 27/3281 438/22 |
| 7,964,439 | B2 * | 6/2011 | Kim ..................... H01L 51/0004 438/99 |
| 9,178,185 | B2 * | 11/2015 | Harikrishna Mohan ..................... H01L 51/5072 |
| 2002/0148113 | A1 * | 10/2002 | Forrest .................. B82Y 10/00 29/847 |
| 2003/0207500 | A1 * | 11/2003 | Pichler ................ H01L 51/5253 438/127 |

(Continued)

OTHER PUBLICATIONS

"Coating with Blasting," Press Information Fraunhofer, Dresden, www.fep.fraunhofer.de/de/press_media/07_2016.html?utm_campaign=pm1607de, May 17, 2016, Translation downloaded Jan. 17, 2018, 5 pages.

*Primary Examiner* — Andres Munoz
(74) *Attorney, Agent, or Firm* — Slater Matsil, LLP

(57) ABSTRACT

A method for producing an organic electronic device is disclosed. In an embodiment the method includes applying an organic material to a substrate to form at least one organic functional layer, applying a patterned electrode material to the at least one organic functional layer by a first mask, and removing the organic material from regions which are free of the electrode material.

18 Claims, 4 Drawing Sheets

(56) References Cited

U.S. PATENT DOCUMENTS

| | | | |
|---|---|---|---|
| 2005/0217717 A1* | 10/2005 | Faris | H01L 31/0392 |
| | | | 136/252 |
| 2007/0080356 A1* | 4/2007 | Nakayama | H01L 27/12 |
| | | | 257/88 |
| 2008/0042139 A1 | 2/2008 | Huh et al. | |
| 2008/0128686 A1* | 6/2008 | Kwon | H01L 51/5218 |
| | | | 257/40 |
| 2009/0061724 A1 | 3/2009 | Cok et al. | |
| 2009/0184636 A1* | 7/2009 | Cok | H01L 51/5234 |
| | | | 313/505 |
| 2009/0212687 A1* | 8/2009 | Cok | H01L 51/5265 |
| | | | 313/504 |
| 2010/0164369 A1* | 7/2010 | Yeh | H01L 51/5256 |
| | | | 313/504 |
| 2011/0053314 A1* | 3/2011 | Burroughes | H01L 51/0017 |
| | | | 438/99 |
| 2013/0009135 A1* | 1/2013 | Katsuhara | H01L 51/0562 |
| | | | 257/40 |
| 2014/0151679 A1* | 6/2014 | Fleissner | H01L 51/0023 |
| | | | 257/40 |

\* cited by examiner

METHOD FOR PRODUCING AN ORGANIC ELECTRONIC DEVICE

CROSS-REFERENCE TO RELATED APPLICATIONS

This application claims the benefit of German Patent Application No. 10 2017 100 929.9, filed on Jan. 18, 2017, which application is hereby incorporated herein by reference.

TECHNICAL FIELD

A method is provided for producing an organic electronic device.

BACKGROUND

Organic electronic devices such as, for example, organic light-emitting diodes (OLEDs) are conventionally produced in the form of an assembly of a plurality of devices on a common substrate. The individual devices are then obtained by dividing up the assembly. Patterned application of the individual layers of the devices, i.e., for instance of electrodes and organic layers, is therefore necessary, for which purpose different masks are conventionally required.

The use of masks is however associated inter alia with the risk of imprecise imaging due to possible vapor creepage under the masks, such that it may be possible, for example, for organic layers to project beyond the surface regions provided therefor. Even slight mask distortions and/or inaccuracies may lead to vapor creepage. In addition, masks are expensive and moreover maintenance-heavy, for example, with regard to particle contamination and scratching. Furthermore, masks have to be aligned with the substrate, wherein the tolerances to be taken into account during this process may restrict design freedom and packing density, i.e., the number of devices on a common substrate and thus the device area per substrate area.

The use of masks may thus lead not only to high costs and handling complexity but also to poor or defective components. For example, organic residues between electrode and conductive track patterns may lead to high intermediate resistances, which may lead to a loss in efficiency and to destruction through local temperature input and/or to a reduction in layer adhesion and to layer delamination. Major effort is required, however, to identify defective devices as being such after manufacture. It is therefore conventionally attempted to carry out complex quality monitoring of the masks and masking processes, in order, for example, to avoid sources of defects such as undulations, distortion or misalignment of the masks, which may inter alia promote vapor creepage underneath them. Use is made, for example, of special mask materials, for example, of Invar, and/or stepped masks. Such measures are complex and costly, however.

SUMMARY

Embodiments of the present invention provide a method for producing an organic electronic device.

According to at least one embodiment, in a method for producing an organic electronic device a substrate is provided. Organic material for forming at least one organic functional layer is applied onto the substrate.

The substrate may, for example, comprise or consist of one or more materials selected from glass, plastics, ceramics, metal and semiconductor materials. In particular, the substrate may also be provided and configured for producing a plurality of devices in an assembly. One surface region corresponding to a subsequent device may be provided on the substrate for each device. In other words, organic and further materials are applied to the substrate in neighboring regions to produce a plurality of organic electronic devices. It may also be that one or more materials are applied over a large area and then patterned in accordance with the regions provided. Although the following description relates to an individual organic electronic device, the features and embodiments described accordingly also apply to a plurality of devices produced jointly in an assembly on the substrate.

The organic electronic device may, for example, be an organic optoelectronic device such as, for example, an organic light-emitting diode or an organic photodiode. In this case, the at least one organic functional layer may comprise or be one or more or all of the layers of an organic functional layer sequence and in particular comprise or be at least one organic optoelectronic layer, i.e. an organic light-emitting layer or an organic light-detecting layer. Furthermore, the organic functional layer sequences and thus the at least one organic functional layer may comprise at least one or more organic electronic layers, which may be selected from charge carrier injection layers, charge carrier transport layers and charge carrier blocking layers. Particularly preferably, the at least one organic functional layer described here and hereinafter and thus the described organic material comprises the entire organic functional layer sequence and thus all the organic electronic and optoelectronic layers. As an alternative to an optoelectronic device, the organic electronic device may also be configured without optoelectronic functionality, i.e., with purely electronic functionality. The organic electronic device may in this case, for example, take the form of an organic transistor.

The organic material for forming the at least one organic functional layer may comprise organic polymers, organic oligomers, organic monomers, organic small, non-polymeric molecules ("small molecules") and combinations thereof. Application of the organic material may accordingly proceed, for example, by means of physical vapor deposition, for instance by means of vacuum evaporation, or by means of liquid-phase deposition.

For electrical contacting of the at least one organic functional layer, electrode materials are moreover applied, which may form electrode layers or parts of electrode layers. Depending on the configuration of the organic electronic device, electrode materials may be applied on one side or on different sides of the at least one organic functional layer and be applied there in different regions. For example, electrode materials may be applied between the substrate and the at least one organic functional layer and, viewed from the substrate, on the at least one organic functional layer or indeed on just the at least one organic functional layer.

According to one further embodiment, an electrode material is applied to the at least one organic functional layer, i.e. to a side of the organic material remote from the substrate. The electrode material may in particular be applied patterned, i.e., not over a large area covering the entire substrate but rather only in predetermined sub-regions, while other sub-regions remain free of the electrode material. The electrode material may to this end be applied to the at least one organic functional layer in particular using a first mask. The first mask may particularly preferably be a shadow mask, which, to protect the organic material, is preferably arranged over the organic material at a distance therefrom. Application of the electrode material may proceed, for example, by means of physical vapor deposition such as for instance vacuum evaporation and/or sputtering.

The electrode material may, for example, comprise or be a metal, which may particularly preferably be selected from aluminum, barium, indium, silver, gold, chromium, titanium, magnesium, calcium and lithium and compounds, combinations and alloys with one or more of the stated materials. Furthermore, the electrode material may additionally or alternatively also comprise a transparent conductive oxide (TCO), for example, zinc oxide, tin oxide, cadmium oxide, titanium oxide, indium oxide, indium tin oxide (ITO), $Zn_2SnO_4$, $CdSnO_3$, $ZnSnO_3$, $MgIn_2O_4$, $GaInO_3$, $Zn_2In_2O_5$ or $In_4Sn_3O_{12}$, and mixtures of different transparent conductive oxides.

Furthermore, a further electrode material may be arranged or applied on the substrate prior to application of the organic material for forming the at least one organic functional layer, which further electrode material may form an electrode layer which in the finished device is arranged between the substrate and the at least one organic functional layer. The organic material is thus in this case applied at least to the further electrode material and may partially or completely cover it. The further electrode material may comprise or consist of one or more materials which have been described above in relation to the electrode material which is applied to the organic material.

Furthermore, at least one electrode connection piece may be applied to the substrate, with which connection piece the electrode material applied to the organic material may be electrically contacted in the finished device. The electrode connection piece may comprise or consist of one layer. This one layer may in particular comprise the same material as the further electrode material. For example, the at least one electrode connection piece or at least one layer thereof may be applied jointly with the further electrode material to the substrate prior to application of the organic material. The at least one electrode connection piece may in particular be applied spatially separately from the further electrode material. Furthermore, the at least one electrode connection piece may comprise multiple layers. The metals and TCOs stated in relation to the electrode materials may be suitable as materials for the at least one electrode connection piece.

According to one further embodiment, organic material is removed in regions which are free of, i.e., not covered by, the electrode material applied patterned to the at least one organic functional layer. The organic material is thus post-patterned in this method step. Particularly preferably, the organic material may be removed in all regions which are not covered by the electrode material applied thereto, such that after post-patterning the organic material only remains arranged beneath the electrode material. On removal of the organic material, the electrode material may thus in particular serve as a mask, which covers those regions of the organic material which are to remain on the substrate. In other words, the electrode material pattern is transferred to the organic material.

According to one further embodiment, the organic material is removed using an etching method. In particular, the electrode material which has been applied to the organic material may, as described above, serve as a mask for the etching method. A suitable etching method may preferably be a dry etching method, in particular a plasma-enhanced dry etching method, with which extensive etching is possible. Furthermore, the etching method may comprise ablation by radiant energy input. To this end, an electron beam may in particular be used, such that the etching method may be an electron beam-induced vapor phase etching method, in particular an electron beam-induced plasma etching method or dry etching method.

According to one further embodiment, the organic material is applied unpatterned over a large area. In other words, the organic material is applied in a mask-less process, i.e., no mask is used to pattern the organic material at the point of application. Through the above-described post-patterning of the organic material, it may be removed from those regions which are free of the electrode material applied to the organic material and thus patterned only after application of the electrode material. If devices are produced in an assembly in multiple regions on the substrate, the organic material may in particular be applied unpatterned and extensively over the entire substrate surface and thus in and between the regions provided for the devices.

It may furthermore also be possible for the organic material to be applied patterned by means of the first mask, with which the electrode material is then also applied. In other words, the same mask, namely the first mask, may be used both for application of the organic material and for application of the electrode material. Through the above-described post-patterning of the organic material using the electrode material as a mask, organic material which may have been applied by undesired vapor creepage under the first mask in regions which are intended to remain free of the organic material may be removed again.

According to one further embodiment, a first sublayer of an electrode layer is formed by application of the electrode material to the organic material. After post-patterning the organic material using the electrode material, i.e., the first sublayer, as a mask, a further electrode material may be applied to form a second sublayer of the electrode layer. The further electrode material, which may comprise or consist of an above-stated material and may be applied accordingly, may be applied at least partly or completely on the first sublayer. In particular, the further electrode material, i.e., the second sublayer, may be applied patterned by means of a second mask. In particular, the second sublayer may project laterally, i.e., in a direction parallel to the main plane of extension of the substrate, beyond the first sublayer. The further electrode material of the second sublayer may be applied in a region from which organic material was previously removed. Furthermore, the second sublayer may connect the first sublayer electrically with an electrode connection piece, spatially separated from the first sublayer, on the substrate. Alternatively, such an electrical connection may also be achieved by means of wire bonding.

According to one further embodiment, on application of the organic material, organic material is also applied to at least one electrode connection piece on the substrate. Organic material may thereafter again be removed at least in part or completely from the at least one electrode connection piece by the above-described post-patterning of the organic material, in that organic material is removed from the at least one electrode connection piece by using the electrode material on the organic material as a mask. In this case, the above-described application of a further electrode material as a second sublayer of an electrode layer may advantageously be used for electrical connection of the electrode material forming the first sublayer of the electrode layer to the at least one electrode connection piece. Alternatively, prior to patterned application of the electrode material to the organic material, organic material may be removed wholly or in part from the at least one electrode connection piece. This may proceed, for example, by means of a sacrificial layer process, by means of a microplasma and/or by electron beam etching, in particular an electron beam-induced plasma etching method or dry etching method. The electrode material may then be applied patterned in such a way to the organic material that the electrode material directly contacts the at least one electrode connection piece. In other words, the electrode material is also applied to the at least one electrode connection piece in the region from which the organic material was previously removed.

In the method described here, the number of masks conventionally used to apply the organic material and the electrode material thereover may advantageously be reduced, so achieving a cost reduction and a reduction in possible sources of defect. Furthermore, freedom of design is increased in comparison with the known methods, while proven processability may be maintained.

BRIEF DESCRIPTION OF THE DRAWINGS

Further advantages, advantageous embodiments and further developments are revealed by the exemplary embodiments described below in connection with the figures, in which.

Figure 1:
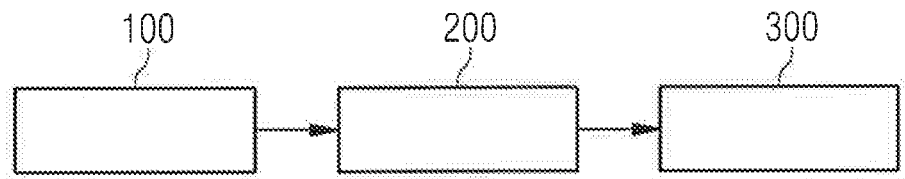
FIG. 1 is a schematic representation of a method for producing an organic electronic device according to one exemplary embodiment.

In the exemplary embodiments and figures, identical, similar or identically acting elements are provided in each case with the same reference numerals. The elements illustrated and their size ratios to one another should not be regarded as being to scale, but rather individual elements, such as, for example, layers, components, devices and regions, may have been made exaggeratedly large to illustrate them better and/or to aid comprehension.

DETAILED DESCRIPTION OF ILLUSTRATIVE EMBODIMENTS

FIG. 1 shows one exemplary embodiment of a method for producing an organic electronic device. To this end, in a first method step 100 organic material is applied to a substrate to form at least one organic functional layer. In a further method step 200, an electrode material is applied patterned by means of a first mask to the at least one functional layer. In a further method step 300, organic material is removed in regions which are free of the electrode material. Prior to and/or between and/or after the described method steps, further method steps may be performed to produce further elements and/or layers of the device and to finish the organic electronic device. For example, in addition to the electrode material which is applied in method step 200, further electrode material may be applied, in particular in order electrically to contact the at least one organic functional layer.

An encapsulation, for example, with or of a thin-film encapsulation and/or with or of a cover, may moreover be applied.

Further exemplary embodiments and features of the method for producing the organic electronic device are described in conjunction with the subsequent figures, these constituting configurations, modifications and further developments of the method described in relation to FIG. 1. In this respect, FIGS. 2A to 6C each show portions of a substrate 1 with layers applied thereto.

Figure 2A:
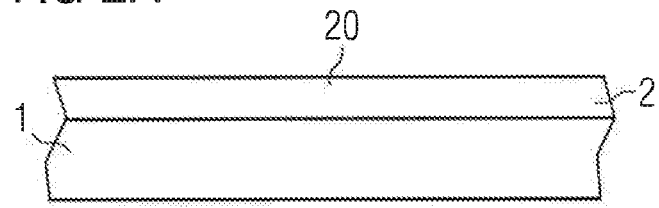
FIGS. 2A to 2C are schematic representations of method steps of a method according to a further exemplary embodiment.
Figure 2B:
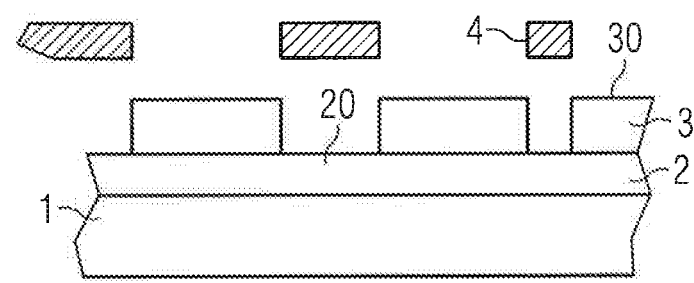
Figure 2C:
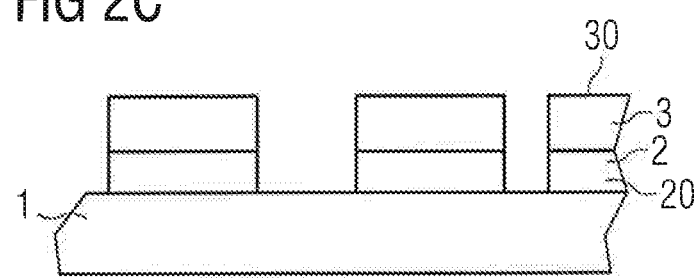

FIGS. 2A to 2C show method steps of a method according to one exemplary embodiment in which, as shown in FIG. 2A, organic material 20 is applied unpatterned over a large area of a substrate 1. The substrate 1 may, for example, comprise or consist of one or more materials selected from glass, plastics, ceramics, metal and semiconductor materials and be provided and designed to produce one or a plurality of organic electronic devices. In the case of a plurality of devices, an assembly of the plurality of organic electronic devices is produced with the substrate 1 as common substrate. By subdividing the assembly, i.e., in particular by subdividing the common substrate 1, the assembly may be singulated into the individual devices.

The organic material 20, which may be applied, for example, by vacuum evaporation or liquid-phase deposition depending on material composition, as described in the general part of the description, forms at least one organic functional layer 2, which, after application, is accordingly applied contiguously and over a large area, i.e., in particular unpatterned and preferably over the entire surface, of the substrate 1. In particular, the organic material 20 may be applied in the form of different organic materials as an organic functional layer sequence which may exhibit electronic and/or optoelectronic properties depending on the functionality of the organic electronic device. The organic electronic device may, for example, as described above in the general part of the description, be an organic optoelectronic device, for instance an organic light-emitting diode or an organic photodiode, or a purely electronic device, for instance an organic transistor.

After unpatterned application of the organic material 20 without shadow mask, in a further method step, as shown in FIG. 2B, an electrode material 30 is applied patterned to the organic material 20. To this end, a first mask 4 is provided, which may in particular be a shadow mask and which comprises openings over those regions in which the electrode material 30 is to be applied. The electrode material 30 may comprise or consist of one or more of the metals and/or TCOs described in the general part of the description and, for example, be applied by means of physical vapor deposition (PVD) such as for instance vacuum evaporation and/or sputtering. In the exemplary embodiment shown, the first mask 4 is thus used for the masked PVD method for application of the electrode material 30, while application of the organic material 20 proceeds without a mask. The electrode material 30 may form an electrode layer 3 on the organic material 20, which allows electrical contacting of the organic material 20 from a side remote from the substrate 1 when the finished organic electronic device is in operation. In accordance with the configuration of the organic electronic device, the electrode layer 3 may have a desired pattern, wherein the pattern shown in FIG. 2B should be understood to be purely by way of example.

As shown in FIG. 2C, in a further method step organic material 20 is removed in regions which are free of the electrode material 30 and which are thus not covered by the electrode layer 3. In particular, the organic material 20 may be removed from all points where no electrode material 30 has been applied, i.e., from all regions which are free of the electrode material 30. In other words, the pattern of the electrode material 30 is transferred to the organic material 20 in a material-removing process step and the organic material 20 is thereby patterned. The electrode material 30 thus serves as a mask for post-patterning of the organic material 20. The organic material 20 is removed by means of an etching method, preferably by means of a dry etching method, in particular a plasma-enhanced dry etching method, with which extensive etching is possible and/or by means of ablation using radiant energy input, preferably by means of an electron beam, such that in this case the etching method may be an electron beam-induced vapor phase etching method.

The organic electronic device may be finished in further method steps (not shown). For example, an encapsulation may be applied over the organic material 20 and the electrode layer 3, which may provide protection from harmful environmental influences such as, for example, oxygen, hydrogen sulfide and moisture and from mechanical damage.

FIGS. 2A to 2C and also subsequent FIGS. 3A to 6C show the organic material 20 in each case directly on the substrate 1. Alternatively, prior to application of the organic material 20 to form the at least one organic functional layer 2, a further electrode material may be applied to the substrate 1 which may form a lower electrode layer which, in the finished device, is arranged between the substrate 1 and the at least one organic functional layer 2. The further electrode layer may be of large-area or patterned configuration and allow electrical contacting of the at least one organic functional layer 2 from the substrate side when the finished organic electronic device is in operation. The organic material 20 may partly or completely cover the lower electrode layer. The further electrode material of the lower electrode layer may comprise or consist of one or more materials which have been described above in relation to the electrode material which is applied to the organic material. In the case of an organic optoelectronic device, for example, one of the electrode layers is transmissive to light. Furthermore, the lower electrode layer may form an anode and the upper electrode layer 3 formed by the electrode material 30 may form a cathode. However, the reverse electrical polarity is also possible.

FIGS. 3A to 3D show method steps of a method according to a further exemplary embodiment in which, unlike in the previous exemplary embodiment, at least one electrode connection piece 5 is applied to the substrate 1 prior to application of the organic material 20. The electrode connection piece 5 may be single- or multilayered and, for example, comprise the same material as the electrode material 30 and/or as an electrode material (not shown) between the substrate 1 and the organic material 20. For example, the at least one electrode connection piece 5 or at least one layer thereof may be applied to the substrate 1 jointly with a further electrode material prior to application of the organic material 20. As in the previous exemplary embodiment, the organic material 20 is applied unpatterned over the entire surface, such that the at least one electrode connection piece 5 is also completely covered by the organic material 20.

Figure 3A:
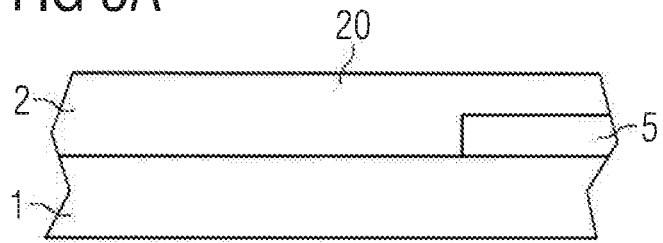
FIGS. 3A to 3D are schematic representations of method steps of a method according to a further exemplary embodiment.
Figure 3B:
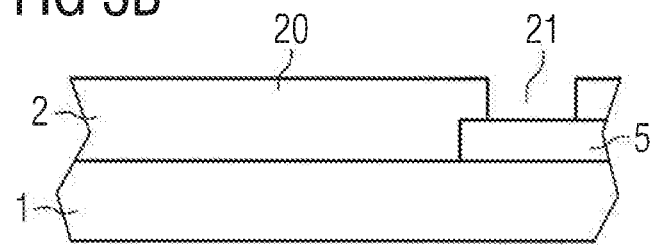
Figure 3C:
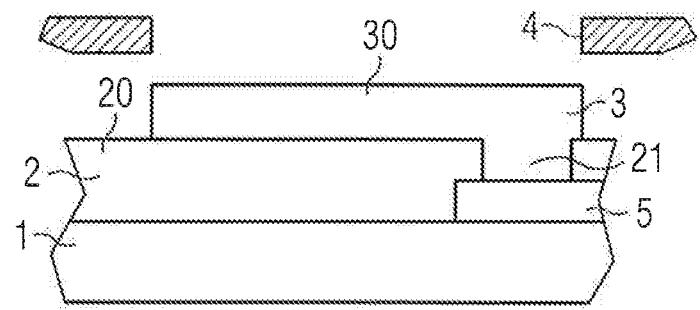

As shown in FIG. 3B, in a further method step prior to patterned application of the electrode material 30 through the first mask 4 shown in FIG. 3C, organic material 20 is removed wholly or, as shown in FIG. 3B, in part from the at least one electrode connection piece 5 in a region 21. Such local removal of organic material 20 may proceed, for example, by means of a sacrificial layer process, by means of a microplasma and/or by means of electron beam etching.

Figure 3D:
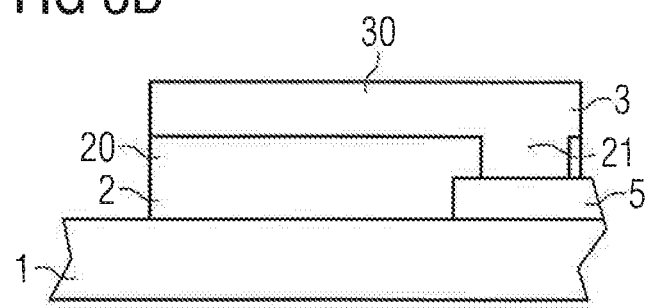

As shown in FIG. 3C, the electrode material 30 is applied patterned to the organic material 20 and in particular also to the exposed region 21 over the at least one electrode connection piece 5 in such a way that the electrode material 30 directly contacts the at least one electrode connection piece 5. As in the previous exemplary embodiment, in a further method step, as shown in FIG. 3D, the organic material 20 is post-patterned using the electrode material 30 as a mask.

Figure 4A:
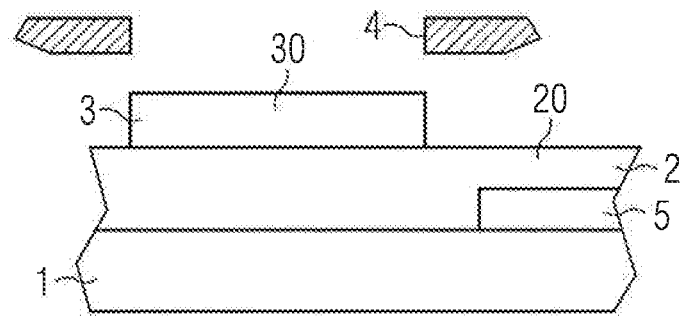
FIGS. 4A to 4C and FIG. 5 are schematic representations of method steps of methods according to further exemplary embodiments.
Figure 4B:
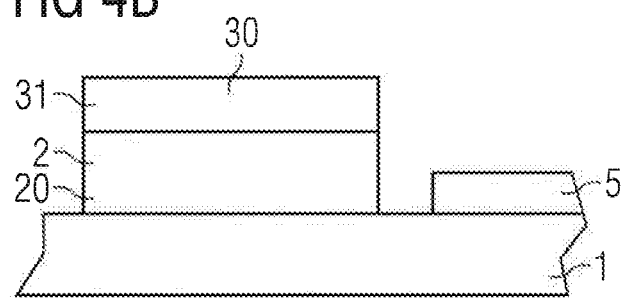
Figure 4C:
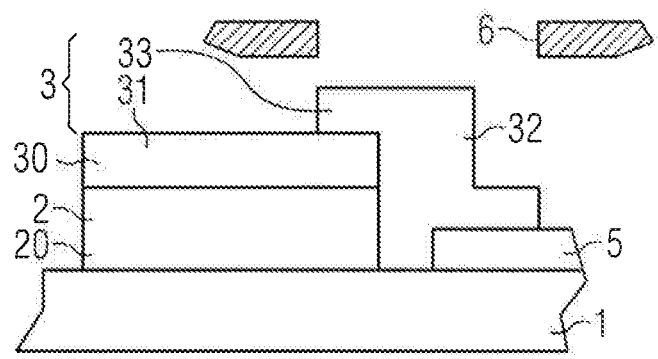

FIGS. 4A to 4C show a further exemplary embodiment, in which, unlike in the previous exemplary embodiment, the at least one electrode connection piece 5 is partly or, as shown in FIG. 4B, completely exposed after unpatterned application of the organic material 20 and patterned application of the electrode material 30 (see FIG. 4A) by removing organic material 20 in the regions which are free of electrode material 30. The electrode material 30 in this case forms a first sublayer 31.

In a further method step, as shown in FIG. 4C, using a second mask 6 a further electrode material 32 is applied in the form of a second sublayer 33 at least in part to the first sublayer 31 and the at least one electrode connection piece 5. The first and second sublayers 31, 33 together form the upper electrode layer 3, with which the organic material 30 is electrically contacted by means of the at least one electrode connection piece 5 from the side remote from the substrate 1. Application of the second sublayer 33 may thus proceed using masked PVD, as in the case of production of the first sublayer 31. In the exemplary embodiment shown, the second mask 6 and thus the second sublayer 33 are arranged laterally offset relative to the first mask 4 and the first sublayer 31, such that the further electrode material 32 forming the second sublayer 33 is applied in particular also to regions which were formerly covered by organic material 20. Alternatively, application of the second sublayer 33 may also proceed without a mask if the pattern underneath is suitable. The second sublayer 33 may moreover also completely cover the first sublayer 31.

Figure 5:
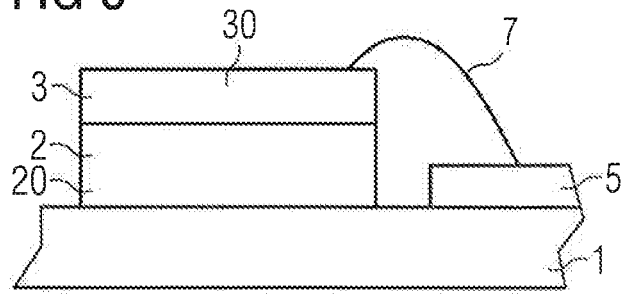

As an alternative to applying a further electrode material 32 to form the second sublayer 33, it is possible, as shown in FIG. 5, to achieve an electrical connection between the electrode layer 3 arranged on the organic material 20 and the electronic patterns on the substrate side formed by the at least one electrode connection piece 5 by means of wire bonding, i.e., for example, by means of a bonding wire 7.

Figure 6A:
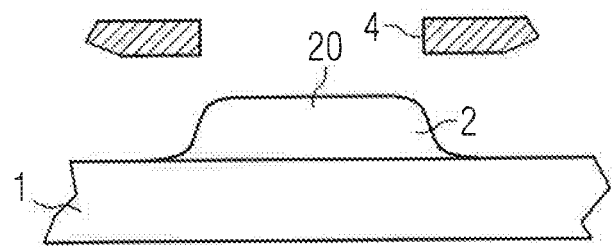
FIGS. 6A to 6C are schematic representations of method steps of a method according to a further exemplary embodiment.
Figure 6B:
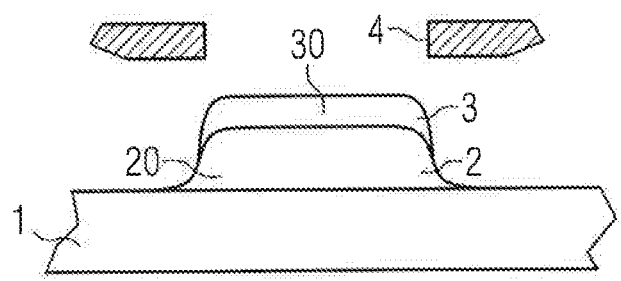
Figure 6C:
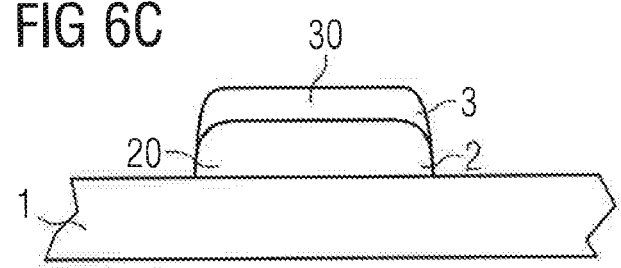

FIGS. 6A to 6C show method steps of a method according to a further exemplary embodiment, in which, as shown in FIG. 6A, the organic material 20 is applied patterned by means of the same first mask 4 with which the electrode material 30 is then also applied. The organic material 20 is thus already applied substantially in those regions in which the electrode material 30 is thereafter also applied. Application of the organic material 20 and of the electrode material 30 thus proceeds using the same shadow mask. As indicated in FIG. 6A, the organic material 20 is not sharply defined at the edges of the mask opening, but rather, due to vapor creepage under the first mask 4, more or less steeply sloping flanks may arise at the edges of the organic material which may extend laterally under the first mask 4.

As in the previous exemplary embodiments, in a further method step the electrode material 30 is deposited through the first mask 4 onto the organic material 20, wherein a part of the flanks of the organic material 20 is covered by the electrode material 30 and a further part of the flanks of the organic material 20 lying further outwards in the lateral direction remains free of the electrode material 30, as indicated in FIG. 6B. As a result of the subsequent step of post-patterning the organic material 20 using the electrode material 30 as a mask, the part of the flanks of the organic material 20 not covered by the electrode material 30 is removed, as shown in FIG. 6C, such that, as in the previous exemplary embodiments, organic material 20 is arranged solely under the electrode material 30 and no organic material residues are present laterally adjacent the electrode material 30. Because the organic material 20 has already been applied patterned by the first mask 4, the effort involved in patterned removal of the organic material 20 adjacent the electrode material 30 may be reduced in comparison with the previous exemplary embodiments. The method steps described in connection with FIGS. 6A to 6C may also be combined with the previous exemplary embodiments.

Figure 7:
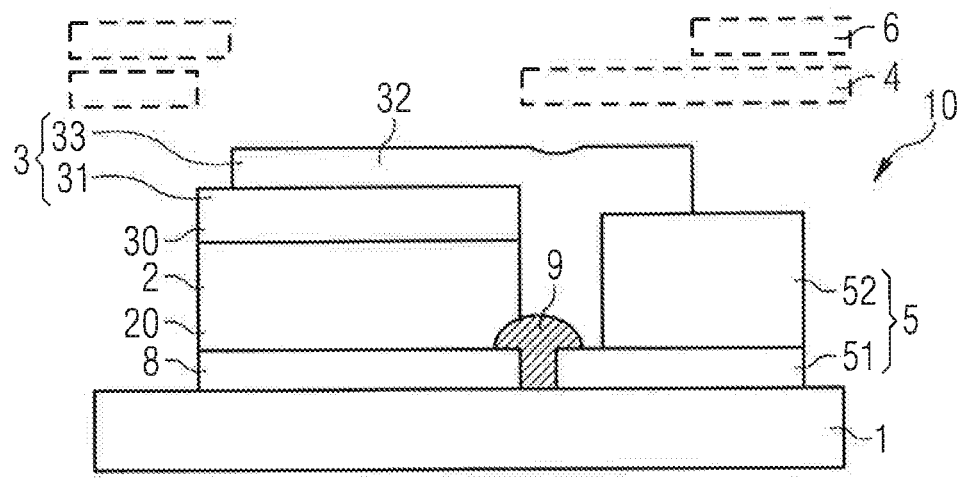
FIG. 7 shows schematic representations of method steps of a method according to a further exemplary embodiment.

By means of the method steps described in relation to FIGS. 1 to 6C and combinations thereof, it is possible, as shown in FIG. 7, for example, to produce an organic electronic device 10 in the form of an organic light-emitting diode or organic photodiode. As in the exemplary embodiment described in FIG. 4C, the device 10 may comprise an upper electrode layer 3 which is formed by a first and second sublayer 31, 33, wherein the second sublayer 33 connects the first sublayer 31 to an electrode connection piece 5. For the sake of clarification, the first and second masks 4, 6 used to apply the electrode materials 30 and 32 are indicated by broken lines above the organic electrical device.

The electrode connection piece 5 in turn comprises two sublayers 51, 52, of which the lower sublayer 51 is formed by the same material as a lower electrode layer 8, in particular by a TCO such as, for example, ITO, wherein the lower electrode layer 8 is arranged between the substrate 1 and the organic material 20. A further sublayer 52, in particular of or with a metal, has been applied to the lower sublayer 51. To insulate the electrode connection piece 5 and the lower electrode layer 8 electrically from one another, an electrically insulating material 9, for example, an electrically insulating oxide or nitride or an electrically insulating polymer, has been arranged between them on the substrate 1.

At least one encapsulation (not shown) may additionally be applied over the electrode layers 3, 8 and the organic material 20 to provide protection from harmful external influences.

The exemplary embodiments and features described in relation to the figures may be combined together according to further exemplary embodiments, even though not all possible combinations have been explicitly described. Moreover, the exemplary embodiments described in relation to the figures may have additional or alternative features according to the general part of the description.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

What is claimed is:

1. A method for producing an organic electronic device, the method comprising:
    applying an organic material to a substrate to form at least one organic functional layer;
    applying a patterned electrode material to the at least one organic functional layer by a first mask, wherein the patterned electrode material is deposited with the first mask in place so that a pattern of the patterned electrode material is formed according to the first mask during deposition of the patterned electrode material; and
    removing the organic material from regions which are free of the patterned electrode material,
    wherein the patterned electrode material is a material for electrically contacting the at least one organic functional layer.

2. The method according to claim 1, wherein removing the organic material comprises etching the organic material with an etching method while the patterned electrode material serves as a mask.

3. The method according to claim 2, wherein the etching method comprises a dry etching method or an ablation by radiant energy input.

4. The method according to claim 1, wherein the organic material is applied patterned by the first mask.

5. The method according to claim 1, wherein the organic material is applied unpatterned.

6. The method according to claim 1, wherein a first sublayer of an electrode layer is formed by applying the patterned electrode material and wherein, after removing the organic material a second electrode material is applied to form a second sublayer of the electrode layer.

7. The method according to claim 6, wherein the second electrode material is applied patterned by a second mask.

8. The method according to claim 6, wherein the second sublayer projects laterally beyond the first sublayer.

9. The method according to claim 6, wherein the second electrode material is applied in a region from which the organic material was removed.

10. The method according to claim 6, wherein the second sublayer electrically connects the first sublayer with an electrode connection piece on the substrate which is spatially separated from the first sublayer.

11. The method according to claim 10, wherein the organic material is applied to the electrode connection piece, and wherein the organic material is removed from the electrode connection piece.

12. The method according to claim 1, wherein the organic material is applied to an electrode connection piece on the substrate and prior to applying the patterned electrode material, the organic material on the electrode connection piece is removed.

13. The method according to claim 12, wherein the patterned electrode material is additionally applied to the electrode connection piece such that the patterned electrode material contacts the electrode connection piece.

14. The method according to claim 1, further comprising applying a second electrode layer on the substrate and then applying the organic material to the second electrode layer.

15. The method according to claim 1, wherein the at least one organic functional layer comprises at least one organic optoelectronic layer.

16. The method according to claim 1, wherein the patterned electrode material is a metal.

17. The method according to claim 1, wherein the patterned electrode material is a transparent conductive oxide (TCO).

18. A method for producing an organic electronic device, the method comprising:
    applying an organic material to a substrate to form at least one organic functional layer;
    applying a patterned electrode material to the at least one organic functional layer by a first mask, wherein the patterned electrode material is deposited with the first mask in place so that a pattern of the patterned electrode material is formed according to the first mask during deposition of the patterned electrode material; and removing the organic material from regions which are free of the patterned electrode material, wherein the at least one organic functional layer comprises an organic functional layer stack comprising at least one organic optoelectronic layer and organic electronic layers.

* * * * *